United States Patent
Kawaguchi et al.

(10) Patent No.: US 8,507,801 B2
(45) Date of Patent: Aug. 13, 2013

(54) PRINTED WIRING BOARD

(75) Inventors: Toshiyuki Kawaguchi, Tokyo (JP); Kazutoki Tahara, Saitama (JP); Tsutomu Saga, Saitama (JP)

(73) Assignee: Shin-Etsu Polymer Co., Ltd. (JP)

( * ) Notice: Subject to any disclaimer, the term of this patent is extended or adjusted under 35 U.S.C. 154(b) by 267 days.

(21) Appl. No.: 13/059,497

(22) PCT Filed: Aug. 18, 2009

(86) PCT No.: PCT/JP2009/064463
§ 371 (c)(1),
(2), (4) Date: Feb. 17, 2011

(87) PCT Pub. No.: WO2010/021328
PCT Pub. Date: Feb. 25, 2010

(65) Prior Publication Data
US 2011/0147053 A1   Jun. 23, 2011

(30) Foreign Application Priority Data
Aug. 19, 2008  (JP) ................ 2008-211100

(51) Int. Cl.
*H05K 1/00*  (2006.01)

(52) U.S. Cl.
USPC ........... 174/254; 174/252; 174/255; 174/256; 174/258; 174/260; 174/262; 174/397; 428/138; 428/209; 428/432; 428/457; 428/522; 216/16; 216/20; 313/582; 315/169.1; 257/215; 338/320

(58) Field of Classification Search
USPC ........... 174/254, 252, 255, 256, 258, 260, 174/262, 397; 428/138, 209, 432, 457, 522; 216/16, 20; 313/582; 315/169.1; 257/215; 338/320
See application file for complete search history.

(56) References Cited

U.S. PATENT DOCUMENTS

| | | | |
|---|---|---|---|
| 4,517,546 A * | 5/1985 | Kakuhashi et al. | 338/320 |
| 4,540,463 A * | 9/1985 | Kakuhashi et al. | 216/16 |
| 6,369,332 B1 * | 4/2002 | Saitoh et al. | 174/260 |
| 6,452,331 B1 * | 9/2002 | Sakurada et al. | 313/582 |
| 6,771,236 B1 * | 8/2004 | Konishi et al. | 345/80 |
| 8,134,084 B2 * | 3/2012 | Kawaguchi et al. | 174/262 |
| 2002/0037397 A1 * | 3/2002 | Suzuki et al. | 428/209 |
| 2002/0140079 A1 * | 10/2002 | Takeyama | 257/698 |
| 2003/0034733 A1 * | 2/2003 | Sakurada et al. | 313/582 |

(Continued)

FOREIGN PATENT DOCUMENTS

| | | |
|---|---|---|
| JP | 2-33999 | 2/1990 |
| JP | 2000-101204 | 4/2000 |

(Continued)

OTHER PUBLICATIONS

International Search Report and Written Opinion mailed Sep. 15, 2009 in corresponding PCT International Application No. PCT/JP2009/064463.

*Primary Examiner* — Xiaoliang Chen
(74) *Attorney, Agent, or Firm* — Ostrolenk Faber LLP

(57) ABSTRACT

A printed wiring board is formed by adhering a coverlay film having a resistance layer formed on a surface of the coverlay film body to a printed wiring board body having a conductive layer formed on a surface of a substrate through an adhesive layer. The resistance layer is separated from and opposed to the conductive layer through the adhesive layer.

6 Claims, 2 Drawing Sheets

(56) References Cited

U.S. PATENT DOCUMENTS

| | | | |
|---|---|---|---|
| 2004/0005443 A1* | 1/2004 | Suzuki et al. | 428/209 |
| 2004/0032957 A1* | 2/2004 | Mansy et al. | 381/67 |
| 2004/0058170 A1* | 3/2004 | Sakurada et al. | 428/432 |
| 2004/0206943 A1* | 10/2004 | Saito et al. | 252/500 |
| 2004/0211591 A1* | 10/2004 | Kumakura et al. | 174/256 |
| 2005/0057171 A1* | 3/2005 | Sakurada et al. | 315/169.1 |
| 2006/0088690 A1* | 4/2006 | Arakawa et al. | 428/138 |
| 2006/0283626 A1* | 12/2006 | Suzuki et al. | 174/255 |
| 2007/0069245 A1* | 3/2007 | Sakurada et al. | 257/215 |
| 2007/0104973 A1* | 5/2007 | Saito et al. | 428/522 |
| 2008/0118762 A1* | 5/2008 | Morimoto et al. | 428/457 |
| 2008/0157030 A1* | 7/2008 | Saito et al. | 252/512 |
| 2008/0292891 A1* | 11/2008 | Tsutagaya et al. | 428/457 |

FOREIGN PATENT DOCUMENTS

| | | |
|---|---|---|
| JP | 2000-269632 | 9/2000 |
| JP | 2004-119604 | 4/2004 |
| JP | 2008-28165 | 2/2008 |
| WO | WO 2008/044698 | 4/2008 |

* cited by examiner

PRINTED WIRING BOARD

CROSS-REFERENCE TO RELATED APPLICATIONS

The present application is a 35 U.S.C. §§371 national phase conversion of PCT/JP2009/064463, filed Aug. 18, 2009, which claims priority of Japanese Patent Application No. 2008-211100, filed Aug. 19, 2008, the contents of which are incorporated herein by reference. The PCT International Application was published in the Japanese language.

TECHNICAL FIELD

The present invention relates to a printed wiring board having a function of suppressing conductive noise.

BACKGROUND ART

Recently, as ubiquitous society appears, the signal transmission rate of information processing apparatuses and communication apparatuses has been improved, and the size thereof has been reduced. In servers, work stations, PCs, mobile phones, game consoles and the like, MPUs (micro processing units) have become faster, are more multifunctional and are more complexed, and storage devices, such as memory, have become faster.

However, electromagnetic wave noise radiated from these apparatuses or conductive noise passing through a conductor in the apparatuses cause malfunction of the apparatuses or another apparatuses. As one countermeasure against this problem, an electromagnetic wave shield function has been applied to a flexible printed wiring board.

As flexible printed wiring boards having the electromagnetic wave shield function, for example, the following flexible printed wiring boards have been proposed.

(1) A flexible printed wiring board, in which an undercoat layer, a shield layer to which conductive paste including metal powder is applied, and an overcoat layer are provided in this order on a copper foil wiring circuit on a surface of a heat resistant plastic film, and a ground pattern of the copper foil wiring circuit and the shield layer are electrically connected to each other at a predetermined distance through the undercoat layer (Patent Document 1).

(2) A flexible printed wiring board, in which an electromagnetic wave shield film provided with a metal thin film layer and a conductive adhesive layer including a metal filler in this order on one surface of a coverlay film is provided on a substrate film provided with an insulating layer for insulating a printed circuit other than a part of a ground circuit in the printed wiring board so that the conductive adhesive layer is adhered to the insulating layer and a part of the ground circuit (Patent Document 2).

However, the above-described flexible printed wiring boards (1), (2) have the electromagnetic wave shield function, but cannot suppress conductive noise passing through the conductive layers of the flexible printed wiring boards.

Patent Document 1: Japanese Patent Application Laid-Open No. Hei 2-33999.
Patent Document 2: Japanese Patent Application Laid-Open No 2000-269632.

DISCLOSURE OF INVENTION

Problem To Be Solved by the Invention

The invention is to provide a printed wiring board having a function of suppressing conductive noise.

Means for Solving the Problem

According to an aspect of the invention, there is provided a printed wiring board formed by adhering a coverlay film having a resistance layer formed on a surface of the coverlay film body to a printed wiring board body having a conductive layer formed on a surface of a substrate through an adhesive layer, wherein the resistance layer is separated from and opposed to the conductive layer through the adhesive layer.

It is preferable that the resistance layer is opposed and developed in the vicinity of an edge portion of the conductive layer.

It is preferable that the resistance layer is provided along a surface shape of the printed wiring board body.

It is preferable that the resistance layer is not exposed to the outside of the printed wiring board.

It is preferable that the adhesive layer includes insulating powder.

It is preferable that the printed wiring board body is a flexible printed wiring board body having a conductive layer formed on a surface of a polymer film.

Effect of the Invention

According to the printed wiring board of the invention, it is possible to suppress conductive noise passing through the conductive layer.

DETAILED DESCRIPTION OF THE INVENTION

In the specification, "opposed" means that at least one part as viewed from the top overlaps with the other part.

Printed Wiring Board

Figure 1:
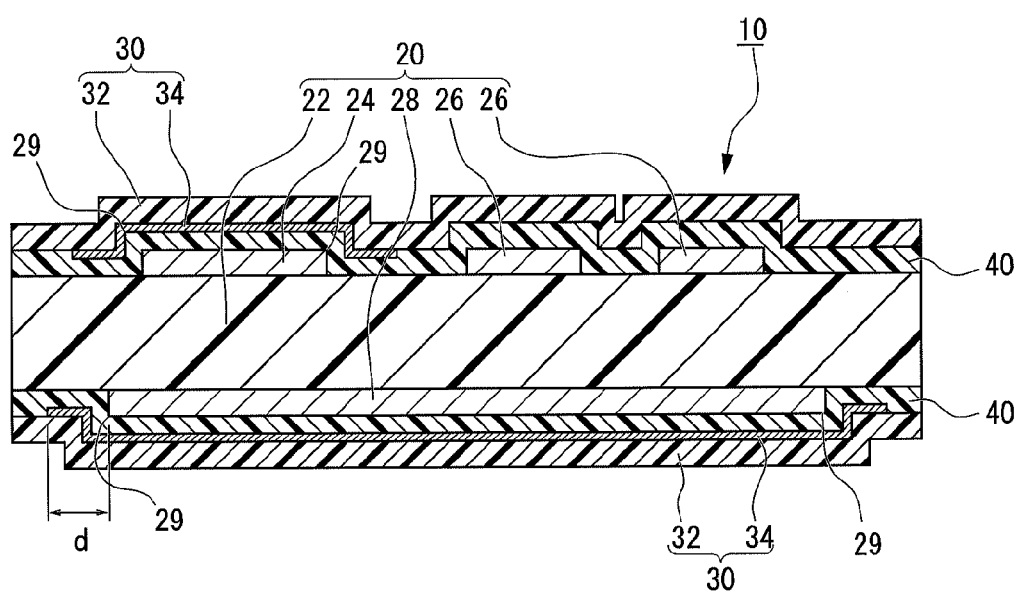
FIG. 1 is a cross-sectional view illustrating an example of a printed wiring board according to the invention.

FIG. 1 is a cross-sectional view illustrating an example of a printed wiring board of the invention. A printed wiring board 10 is formed by adhering a coverlay film 30 to a printed wiring board body 20 through an adhesive film 40. In the printed wiring board body 20, a conductive layer (power supply layer 24 and signal transmission layer 26) is formed on one surface of a substrate 22, and a conductive layer (ground layer 28) is formed on the other surface. In the coverlay film 30, a resistance layer 34 is formed on one surface of a coverlay film body 32.

Printed Wiring Board Body

The printed wiring board body 20 is a conductive layer formed by processing a copper foil of a copper-clad laminated plate in a desired pattern by the known etching method.

The copper-clad laminated plate may have a 3-layer structure in which a copper foil is adhered to the substrate 22 by an adhesive, and may have a 2-layer structure in which a resin solution or the like for forming the substrate 22 is cast onto a copper foil.

Substrate

The substrate 22 is made of glass fiber strengthened epoxy resin, epoxy resin, polyester, PET (polyethylene terephthalate), PEN (polyethylene naphthalate), PC (polycarbonate), polyvinylidene, polyimide, polyphenylene sulfide, liquid crystal polymer, polystyrene, and the like.

When the printed wiring board 10 is a flexible printed wiring board, the substrate 22 is preferably a polymer film.

The surface resistance of the polymer film is preferably $1 \times 10^6 \Omega$ or higher.

The polymer film is preferably a film having heat resistance, and more preferably a polyimide film, a liquid crystal polymer film, and the like.

The thickness of the polymer film is preferably 5 to 50 μm, more preferably 6 to 25 μm from the viewpoint of flexibility, and particularly preferably 10 to 25 μm.

Conductive Layer

The copper foil constituting the conductive layer may be a rolling copper foil, an electrolysis copper foil, and the like, and preferably the rolling copper foil from the viewpoint of flexibility.

The thickness of the copper foil (conductive layer) is preferably 18 to 35 μm.

A lengthwise end (terminal) of the conductive layer is not covered with the coverlay film 30, for solder connection, connector connection, component mounting, and the like.

Coverlay Film Body

The coverlay film body 32 is a polymer film.

The surface resistance of the coverlay film body 32 is preferably $1 \times 10^6 \Omega$ or higher.

The coverlay film body 32 is made of polyimide, liquid crystal polymer, polyaramid, polyphenylene sulfide, polyamide-imide, polyetherimide, polyethylene naphthalate, polyethylene terephthalate, and the like.

The thickness of the coverlay film body 32 is preferably 3 to 25 μm from the viewpoint of flexibility, and particularly preferably 3 to 10 μm from the viewpoint of increasing conformity to a surface shape.

Resistance Layer

The resistance layer 34 is separated from the conductive layer (power supply layer 24 or ground layer 28) through an adhesive layer 40, and is opposed in the vicinity of the conductive layer along the conductive layer. However, the resistance layer 34 is not electrically connected to the conductive layer. The resistance layer 34 suppresses high frequency components, and thus may deteriorate high speed pulse signals of the signal transmission layer 26. Accordingly, it is preferable that the power supply layer 24 or the ground layer 28 is provided between the signal transmission layer 26 and the resistance layer 34.

In the conductive layer, high frequency current (conductive noise) flows intensively in the surface by a surface effect, and thus the high frequency current flows intensively in a ridge portion (edge portion 29) crossing the side face and the upper face. For this reason, electromagnetic wave noise radiates from the edge portion 29, and there is electromagnetic field deflection in the vicinity of the edge portion 29. When there is electromagnetic field deflection, that is, change in magnetic flux density generated from the edge portion 29, it is considered that eddy current is generated in the resistance layer 34 disposed in the vicinity thereof so as to prevent the change in the magnetic flux density (principle of electromagnetic induction), energy is consumed by resistance loss, and the conductive noise flowing in the conductive layer is attenuated (suppressing the conductive noise).

As viewed from mechanism of suppressing the conductive noise, it is preferable that the resistance layer 34 is deployed so as to be opposed in the vicinity of the edge portion 29 of the conductive layer.

To deploy the resistance layer 34 so as to be opposed in the vicinity of the edge portion 29 of the conductive layer, it is preferable that the resistance layer 34 is provided to conform to the surface shape of the conductive layer (i.e., along the surface shape of the printed wiring board body 20).

As viewed from the mechanism of suppressing the conductive noise, it is preferable that a gap (i.e., thickness of the adhesive layer 40) between the resistance layer 34 and the conductive layer is narrow. Specifically, the gap between the resistance layer 34 and the conductive layer is preferable 1 to 100 μm. When the gap between the resistance layer 34 and the conductive layer is less than 1 μm, there are concerns about faults in the insulating between the resistance layer 34 and the conductive layer. When the gap between the resistance layer 34 and the conductive layer is more than 100 μm, the effect of suppressing the conductive noise is reduced and the printed wiring board 10 becomes thicker.

As viewed from the mechanism of suppressing the noise, it is preferable that an effective area of the resistance layer 34 receiving the magnetic flux generated from the edge portion 29 of the conductive layer is wide. The effective area of the resistance layer 34 can be represented as the product of a length of the resistance layer 34 and a width d of the resistance layer 34 which is not opposed to the conductive layer. Accordingly, it is preferable that the width of the resistance layer 34 is larger than the width of the conductive layer. Specifically, the width d is preferably 0.1 mm or more, more preferably 0.5 mm or more, and further more preferably 1.0 mm or more. When the width d is equal to or more than 0.1, it is possible to effectively receive sufficient magnetic flux and it is possible to generate sufficient eddy current. The upper limit of the width d is determined according to the size of the printed wiring board 10. As the frequency of the conductive noise become as high as 1 GHz or higher, the conductive noise easily concentrates at the edge portion 29. Accordingly, even when the width d is small, it is possible to efficiently suppress the conductive noise.

It is preferable that the resistance layer 34 is not exposed to the outside of the printed wiring board 10. When the resistance layer 34 is exposed from a side face of the printed wiring board 10 to the outside, the resistance layer 34 may deteriorate and there may be problems such as migration of materials constituting the resistance layer 34.

The surface resistance of the resistance layer 34 is preferably 5 to 500Ω. When the surface resistance of the resistance layer 34 is lower than 5Ω, it is difficult to obtain sufficient resistance loss even when the eddy current is generated. Accordingly, the effect of suppressing the conductive noise is reduced. When the surface resistance of the resistance layer 34 is higher than 500Ω, it is difficult to generate the eddy current. Therefore, it is difficult to efficiently suppress the conductive noise.

The resistance layer 34 may be made of metal, conductive ceramics, carbon materials, or the like.

When resistivity of the materials is low, it is possible to raise the surface resistance by reducing the thickness of the resistance layer 34. However, it is difficult to control the thickness. Accordingly, it is preferable that the resistance layer 34 is made of materials having relatively high resistivity.

Ferromagnetic metal, paramagnetic metal, and the like may be used as the metal.

Iron, carbonyl iron, iron alloy (Fe—Ni, Fe—Co, Fe—Cr, Fe—Si, Fe—Al, Fe—Cr—Si, Fe—Cr—Al, Fe—Al, Si, Fe—Pt, etc.), cobalt, nickel, alloy thereof, and the like may be used as the ferromagnetic metal.

Gold, silver, copper, tin, lead, tungsten, silicon, aluminum, titanium, chrome, tantalum, molybdenum, alloy thereof, amorphous alloy, alloy with ferromagnetic metal, and the like may be used as the paramagnetic metal.

From the viewpoint of resistance to oxidization, it is preferable to use nickel, iron-chrome alloy, tungsten, chrome, and tantalum, as the metal. For practical use, it is more preferable to use nickel, nickel-chrome alloy, iron-chrome alloy, tungsten, chrome, and tantalum, and it is particularly preferable to use nickel or nickel alloy.

Alloy including metal and one or more elements selected from the group consisting of boron, carbon, nitrogen, silicon, phosphorus, and sulfur, metal compound, solid solution, and the like may be used as the conductive ceramics. Specifically, nickel nitride, titanium nitride, tantalum nitride, chrome nitride, titanium carbide, silicon carbide, chrome carbide, vanadium carbide, zirconium carbide, molybdenum carbide, tungsten carbide, chrome boride, molybdenum boride, chrome silicide, zirconium silicide, and the like may be used.

It is possible to easily obtain the conductive ceramics by using gas including one or more elements selected from the group consisting of nitrogen, carbon, silicon, boron, phosphorus, and sulfur, as reactive gas in a physical vapor deposition method.

Amorphous carbon, graphite, DLC (diamond-like carbon), and the like may be used as the carbon material.

For example, the resistance layer 34 is formed by processing a resistance vapor deposition film formed by a physical vapor deposition method (EB vapor deposition method, ion beam method, sputtering method, etc.) on the surface of the coverlay film body 32 by the known wet method (wet etching method), dry method, (plasma etching method, laser abrasion method), and the like into a desired pattern.

The thickness of the resistance layer 34 is preferably 5 to 50 nm from the viewpoint of flexibility.

Adhesive Layer

The adhesive layer 40 is formed by, for example, hardening or solidifying a commercially available adhesive sheet (bonding sheet). In the same manner as the known method of producing a coverlay film, when a wet adhesive is applied onto the coverlay film body and dried to form the adhesive layer, there are the following problems: (i) the coverlay film having the patterned resistance layer formed thereon is curled and the positioning thereafter becomes difficult, (ii) the patterning size is changed by heating and thus positioning precision decreases, and (iii) deterioration of the resistance layer is induced. To avoid such problems, it is preferable to use a dry adhesive sheet. In addition, after the resistance layer is etched, it is possible to immediately perform a lamination pressing process on the printed wiring board. Accordingly, it is possible to very simply perform the adhesive process.

The adhesive sheet may be made of B-stage epoxy resin (semi-cured state), thermoplastic polyimide, and the like. The epoxy resin may include a rubber component (carboxyl denatured nitrile rubber, etc.) in order to achieve flexibility.

The adhesive sheet is formed by casting the materials so as to achieve a desired thickness on a heteromorphic film or the like, and then may be made into a continuous sheet shape by peeling off the heteromorphic film, or alternately, the adhesive film may be stored with the heteromorphic film or protective film attached.

The adhesive layer 40 preferably includes insulating powder as a spacer to improve an insulating property between the resistance layer 34 and the conductive layer. The powder may have other functions such as mobility control and flame resistance. Magnesium hydroxide, aluminum hydroxide, antimony oxide, zinc stannate, zinc borate, silicon oxide, titanium oxide, zeolite, fiber-shaped powder (calcium carbonate whisker, zinc oxide whisker, aluminum borate whisker, potassium titanate whisker, etc.), and the like may be used as the insulating powder.

It is preferable to use powder having an aspect ratio of 3 or more since it is possible to effectively align and fix it at the ridge portion of the conductive layer by the movement of the adhesive layer.

A diameter of the insulating powder is preferably ½ thickness to 1/20 thickness of the adhesive layer. When the diameter is less than the thickness within the range, it does not function as an insulating spacer. When the diameter is larger than the thickness within the range, the adhesion may deteriorate.

The combination amount of the insulating powder is about 1 to 30 weight % out of 100 weight % of the adhesive layer. When the combination amount is less than that, a sufficient insulating property is not exhibited. When the combination amount is more than that, problems occurs in the conformity of the surface shape in addition to the decrease in adhesion.

The thickness of the adhesive layer 40 is preferably 1 to 100 µm. To provide the resistance layer 34 along the surface shape of the printed wiring board body 20, it is preferable that the thickness of the adhesive layer 40 is smaller than the thickness of the conductive layer. Wetness of the resistance layer 34 depends on the melting of the adhesive layer 40. When the resistance layer 34 hardly gets wet due to viscosity being higher than that of an adhesive including solvent, adhesion is insufficient. Thus, as an adhesion accelerator, it is preferable to apply an adhesion accelerator such as a silane coupling agent and a titanate coupling agent onto the resistance layer 34.

Vinyltriethoxysilane, vinyltris(2-methoxyethoxy)silane, 3-methacryloxypropyltrimethoxysilane, 3-glycidoxypropyltrimethoxysilane, 2-(3,4-epoxycyclohexyl)ethyltrimethoxysilane, N-2-(aminoethyl)3-aminopropyltrimethoxysilane, N-2-(aminoethyl)3-aminopropylmethyldimethoxysilane, 3-aminopropyltriethoxysilane, N-phenyl-3-aminopropyltrimethoxysilane, 3-mercaptopropyltrimethoxysilane, 3-chloropropyltrimethoxysilane, and the like may be used as the silane coupling agent.

Isopropyltriisostearoyltitanate, isopropyltris(dioctylpyrophosphate)titanate, isopropyltri(N-aminoethyl-aminoethyl)titanate, tetraoctylbis(ditridecylphosphate)titanate, bis(deoctylpyrophosphate)oxyacetatetitanate, bis(dioctylpyrophosphate)ethylenetitanate, isopropyltrioctanoyltitanate, isopropyldimethacrylisostearoyltitanate, isopropylisostearoyldiacryltitanate, tetraisopropylbis(dioctylphosphate)titanate, and the like may be used as the titanate coupling agent.

In the printed wiring board 10 described above, the resistance layer 34 is separated from and opposed to the conductive layer (power supply layer 24 or ground layer 28) through the adhesive layer 40. Accordingly, it is possible to suppress the conductive noise passing through the conductive layer due to the following reasons.

When the electromagnetic wave noise is radiated from the conductive layer, and the electromagnetic field change occurs around the conductive layer, that is, a change occurs in magnetic flux density generated from the conductive layer in the vicinity of the conductive layer, the eddy current occurs in the resistance layer 34 opposed to prevent the change in magnetic flux density, the energy is consumed by the resistance loss, and the conductive noise flowing in the conductive layer is attenuated.

Method of Producing Printed Wiring Board

The printed wiring board 10 is produced by, for example, the following processes (a) to (c):

(a) a process of partially adhering (temporarily fixing) the adhesive sheet onto the surface on which the resistance layer 34 of the coverlay film 30 is formed (b) a process of forming, as is required, a window portion by punching a part corresponding to a lengthwise end of the conductive layer of the printed wiring board body 20 from the coverlay film 30 and the adhesive sheet so as to expose the end (c) a process of overlapping the coverlay film 30, to which the adhesive sheet is temporarily fixed, so as to position the adhesive sheet between the printed wiring board body 20 and the coverlay film 30, on the surface of the printed wiring board body 20 with the conductive layer, and integrating them by a press.

It is preferable to temporarily fix the adhesive film to the coverlay film 30 so as to form a gap in which the coverlay film 30 and the adhesive sheet are not adhered to each other and to partially adhere them so that the gap links with the outside. When the adhesive sheet is partially adhered to the surface of the coverlay film 30, the degassing property of the pressing in the process (c) is improved and generation of bubbles is suppressed in the interface between the coverlay film 30 and the adhesive layer 40.

The adhesive sheet is temporarily fixed to the coverlay film 30, for example, by adhering the coverlay film 30 and the adhesive layer 40 so that the whole surface, or just a marginal part which will not be part of the final product, is in a dot shape.

When the printed wiring board body 20 is overlapped with the coverlay film 30 to which the adhesive sheet is temporarily fixed, a positioning process is performed so that the resistance layer 34 and the conductive layer are opposed to each other. As a method of the positioning process, there is a method of punching a hole on the basis of a mark formed by laser during the pattern process of the resistance layer 34 and passing a positioning needle through the hole, or a method of directly reading a mark by a transmission sensor or a reflection sensor using LED light or X-ray to position them. The later method that is the direct method is preferable since it has a high degree of precision.

EXAMPLES

Hereinafter, example will be described. The invention is not limited the examples.
Thickness of Layers A cross section of a sample was observed using a transmission electron microscope (manufactured by Hitachi, H9000NAR), and thicknesses of five parts of layers were measured and an average thereof was calculated.
Surface Resistance Two thin film metal electrodes (length: 10 mm, width: 5 mm, distance between electrodes: 10 mm) formed by depositing gold onto the quartz glass were used, a measured object is placed on the electrodes, an area of the measured object by 10 mm×20 mm was pressed by load of 50 g, resistance between the electrodes was measured by measurement current of 1 mA or less, and the measured value was set as surface resistance.
Effect of Suppressing Conductive Noise An S21 parameter between both ends of the conductive layer (signal layer) of the printed wiring board was assessed by a network analyzer (Manufactured by Anritsu Corporation, 37247D), and an effect of conductive noise was confirmed.

Example 1

A conductive layer (signal layer) with a line width of 0.5 mm and a line length of 110 mm was formed on one surface of a double-sided copper-clad laminated plate (200 mm×200 mm) formed of a polyimide film with a thickness of 25 μm and a rolling copper foil with a thickness of 18 μm by an etching method. At both ends of the conductive layer, a land portion of 3 mmϕ was formed to mount an SMA connector, and a substantial line length was 100 mm.

A conductive layer (ground layer) of 55 mm×110 mm was formed on the other surface of the double-sided copper-clad laminated plate by an etching method, and a penetration hole was formed at the land portion, thereby producing a printed wiring board body (A).

Nickel was physically deposited onto a surface of a polyimide film of 60 mm×120 mm×thickness 10 μm by a magnetron sputtering method under the flow of nitrogen gas, thereby forming a nickel nitride deposited film (surface resistance: 25Ω) of 58 mm×118 mm×thickness 25 nm. The deposited film was processed by a laser abrasion method to form a resistance layer with a line width of 1.5 mm and a line length of 90 mm, thereby producing a coverlay film (B1).

Nickel-chrome alloy (nickel of 60 weight %) was physically deposited on a surface of a polyimide film of 60 mm×120 mm×thickness 10 μm by the magnetron sputtering method, and a nickel-chrome alloy deposited film (surface resistance: 100Ω) of 58 mm×118 mm×thickness 13 nm was formed, thereby producing a coverlay film (B2).

A bonding sheet (an epoxy adhesive formed of epoxy resin including a rubber component and a latent hardening agent was formed into a film, the film was dried in a B-stage shape, and the bonding sheet of 100 weight % includes, as insulating powder, silica particles of 5 weight % with an average particle diameter of 5 μm and calcium carbonate of 3 weight % with an average fiber length of 1 μm and an average fiber length of 20 μm) of 60 mm×120 mm×thickness 20 μm was partially heated and adhered onto the surfaces of the coverlay film (B1) and the coverlay film (B2) on which the resistance layer was formed. The coverlay film (B1) and the coverlay film (B2) to which the bonding sheet was temporarily fixed were provided with a window portion formed by punching so as to avoid the land portion which enables connection to the SMA connector.

The coverlay film (B1) to which the bonding sheet was temporarily fixed was overlapped on the surface of the printed wiring board body (A) on which the conductive layer (signal layer) was formed so that the bonding sheet was positioned between the printed wiring board body (A) and the coverlay film (B1), and the resistance layer and the conductive layer (except for the land portion) are opposed to each other. The coverlay film (B2) to which the bonding sheet was temporarily fixed was overlapped on the surface of the printed wiring board body (A) on which the conductive layer (ground layer) was formed so that the bonding sheet was positioned between the printed wiring board body (A) and the coverlay film (B2).

They were integrated by heat pressing, thereby obtaining a printed wiring board. In the printed wiring board, the resistance layer was provided along the surface shape of the printed wiring board body (A). As a result, the resistance layer was deployed so as to be opposed in the vicinity of the edge portion of the conductive layer. The resistance layer opposed to the conductive layer was completely covered with the coverlay film (B1), and was not exposed to the outside of the printed wiring board. The width d of the resistance layer which is not opposed to the conductive layer (signal layer) was 0.5 mm.

Figure 2:
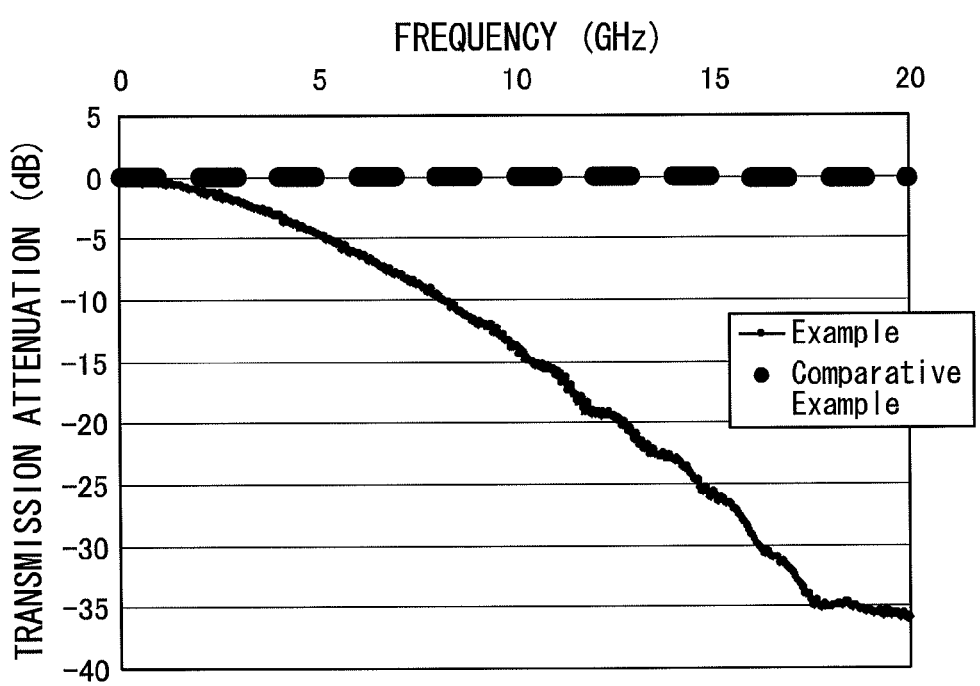
FIG. 2 is a graph illustrating an effect (S21 parameter) of suppressing conductive noise in Example 1 and Comparative Example 1.

In the printed wiring board, the both conductive layers were connected to the penetration hole at the land portion through the SMA connector, the network analyzer was connected to the SMA connector, and then the S21 parameter was assessed. A separately measured value of only the printed wiring board body was canceled to perform correction. The result is shown in FIG. 2.

Comparative Example 1

A printed wiring board was produced in the same manner that of the Example 1 except that no resistance layer was provided, and it was assessed in the same manner as that of Example 1. The result is shown in FIG. 2.

INDUSTRIAL APPLICABILITY

The printed wiring board of the invention is valid as a flexible printed wiring board for small-size electronic apparatuses such as optical modules, mobile phones, digital cameras, and game consoles.

EXPLANATION OF NUMERALS

10 A printed wiring board
20 A printed wiring board body
22 A substrate
24 A power supply layer (A conductive layer)
26 A signal transmission layer
28 A ground layer
29 An edge portion
30 A coverlay film
32 A coverlay film body
34 A resistance layer
40 An adhesive film

The invention claimed is:

1. A printed wiring board comprising:
a printed wiring board body composed of a substrate and a conductive layer formed on a surface of the substrate;
a coverlay film comprising a coverlay film body and a resistance layer formed on a surface of the coverlay film body,
wherein:
the printed wiring board body and the coverlay film body are adhered by an adhesive layer, and
wherein the resistance layer is separated from and opposed to the conductive layer by the adhesive layer.

2. The printed wiring board according to claim 1, wherein the resistance layer is deployed so as to be opposed in the vicinity of an edge portion of the conductive layer.

3. The printed wiring board according to claim 1, wherein the resistance layer is provided along a surface shape of the printed wiring board body.

4. The printed wiring board according to claim 1, wherein the resistance layer is not exposed to the outside of the printed wiring board.

5. The printed wiring board according to claim 1, wherein the adhesive layer includes an insulating powder.

6. The printed wiring board according to claim 1, wherein the printed wiring board body is a flexible printed wiring board body having the conductive layer formed on a surface of a polymer film.

* * * * *